United States Patent [19]

Nelson

[11] Patent Number: 4,923,779
[45] Date of Patent: May 8, 1990

[54] COLOR-CORRECTING EXPOSURE SYSTEM FOR A PHOTOSENSITIVE MEDIA

[75] Inventor: Erik K. Nelson, Centerville, Ohio

[73] Assignee: The Mead Corporation, Dayton, Ohio

[21] Appl. No.: 294,449

[22] Filed: Jan. 9, 1989

[51] Int. Cl.$^5$ .......................... G03C 1/72; G03B 27/70
[52] U.S. Cl. .................................... 430/138; 430/395; 355/27; 355/35; 355/38; 355/66; 355/71
[58] Field of Search ................... 430/138, 395; 355/27, 355/35, 38, 66, 71

[56] References Cited

U.S. PATENT DOCUMENTS

| | | | |
|---|---|---|---|
| 2,698,561 | 1/1955 | Crowell | 355/71 |
| 3,811,770 | 5/1974 | Baur Jr. et al. | 355/67 |
| 4,230,408 | 10/1980 | Nigg | 355/35 |
| 4,806,984 | 2/1989 | Asano | 355/32 |

Primary Examiner—Roland E. Martin
Assistant Examiner—Hoa Van Le
Attorney, Agent, or Firm—Thomas A. Boshinski

[57] ABSTRACT

A method and apparatus for color correction while exposing a photosensitive material are disclosed. The material comprises a supportive substrate which is at least partially transmissive and has a layer of microcapsules on the surface thereof. The microcapsules contain a color precursor and a photohardenable or photosoftenable composition. The substrate is positioned on or near a reflective surface having greater reflectivity within a selected wavelength band. An exposure beam is directed onto the substrate, whereby at least a portion of the beam passes through the substrate to the reflective surface. Since the surface reflects a greater portion of the light within the selected band, color correction is achieved.

4 Claims, 3 Drawing Sheets

COLOR-CORRECTING EXPOSURE SYSTEM FOR A PHOTOSENSITIVE MEDIA

BACKGROUND OF THE INVENTION

The present invention relates to an imaging process and apparatus for forming an image on a photosensitive media. More particularly, the imaging process is designed for use with a photosensitive media having a supportive substrate and a layer of photosensitive microcapsules on the surface thereof, and is intended to provide color correction of an image exposed on the media.

It is well known to expose a photosensitive media to light or other radiation in order to form an image in the media. In one common system for forming such exposures, an exposure beam is directed through an appropriate screen or mask which carries the image information to be reproduced. The beam is then focused onto the photosensitive media. After development of the media, the image is visibly preserved.

One photosensitive media with which this general method can be used is disclosed in commonly-assigned U.S. Pat. Nos. 4,399,209 and 4,440,846. These patents disclose a photosensitive media wherein the imaging sheet comprises a supportive substrate with a layer of microcapsules on the surface thereof. The microcapsules have an internal phase of a photohardenable photosensitive composition and a color former. The microcapsules are imagewise exposed to actinic radiation and ruptured so that the color former reacts with a developer material to produce an image.

U.S. Pat. No. 4,399,209 discloses the photosensitive media as a transfer imaging system. The imaging sheet is contacted with a receiver sheet subsequent to exposure. The receiver sheet includes a developer sheet having a support with a layer of developer material on the surface thereof. After the sheets are placed in contact, rupturing of the microcapsules is carried out.

U.S. Pat. No. 4,440,846 discloses a self-contained imaging system, wherein the imaging sheet has developer material co-deposited with the microcapsules on the sheet surface.

One goal of most imaging systems is to minimize exposure times and exposure source power requirements. The imaging materials described in the above referenced patents provide relatively low film speed when compared to silver halide systems. For the photosensitive media, film speeds on the order of 100 to 1,000 ergs/cm$^2$ are typical.

When producing color images on the photosensitive media, it is often necessary to adjust the color balance within the finished image. This need can result from a color imbalance in the light sources used for exposure, from density variations in the masks used to present the information, or from variations in color sensitivity of the media itself. Typically, color correction is achieved by filtering within the exposure light path. However, such filtering increases the required exposure time. Color correction is achieved by reducing the amount of light received onto two colors in a three-color media to allow the third and slowest color to receive the correct amount of light.

What is needed, therefore, is an imaging system which enables color balancing of the recoded image without a significant reduction in overall exposure time.

SUMMARY OF THE INVENTION

To meet these needs, the present invention provides a method and apparatus for exposing a photosensitive material wherein the material comprises a supportive substrate, the substrate being at least partially transmissive, having a layer of microcapsules on one surface thereof. The microcapsules contain a color precursor and a photohardenable or photosoftenable composition.

The inventive system operates by adding enough light to the slowest of the color capsules to allow the fastest color to determine the overall exposure time.

The method includes supporting the substrate to define a forward surface of the substrate carrying the microcapsules, and to define an opposite, rearward surface of the substrate. Positioned on the side of the substrate corresponding to the rearward surface is a reflective surface. The reflective surface has a greater reflectivity of light within a selected wavelength band than outside the band. An exposure beam is directed onto the forward side of the substrate, whereby at least a portion of the beam passes through the substrate to the reflective surface and is reflected back through the substrate. As a result of the greater reflectivity within the selected wavelength band than outside the selected band, the relative color content of the beam corresponding to the band is increased. This is done in an additive rather than a subtractive manner. Of course, the reflective surface may have increased reflectivity within several different wavelength bands.

The invention also provides apparatus for exposing a photosensitive material. The apparatus includes means for supporting a sheet of the photosensitive material, and means for generating an exposure beam and directing the beam onto photosensitive media supported by the supporting means. A reflector means includes a reflective surface having a greater reflectivity of light within a selected wavelength band than outside the band. Reflector mounting means is provided to position the reflective surface to receive the exposure beam after the beam has been directed onto and passed through the photosensitive material.

The supporting means and the reflector mounting means may together comprise a platen for disposing against a sheet of photosensitive material, the platen having the reflective surface formed thereon.

The reflective surface is preferably a dichroic mirror, which may preferably be positioned against the rearward surface of the substrate.

Accordingly, it is an object of the present invention to provide a method and apparatus for exposing a photosensitive media wherein the media is a microencapsulated media; to provide such a method and apparatus which can be used to perform color balancing during exposure; and to provide such a method and apparatus which can perform color balancing without reducing and preferably while increasing media film speed.

Other objects and advantages of the invention will be apparent from the following description, the accompanying drawings and the appended claims.

DETAILED DESCRIPTION OF THE PREFERRED EMBODIMENTS

The method and apparatus of the present invention for exposing a photosensitive material is preferably used in conjunction with a photosensitive imaging media described in U.S. Pat. Nos. 4,440,846 and 4,399,209, which are hereby incorporated by reference. Such media can be seen by reference to FIGS. 1A–1C, wherein an imaging web 10 is constituted by a substrate 12 coated with a layer of microcapsules 14. The microcapsules 14 are filled with an internal phase 16 containing a photosensitive composition. Usually, the microcapsules 14 also contain chromogenic material; however, chromogenic material can be associated with microcapsules 14 in other ways, such as by incorporation into the microcapsule wall or a layer contiguous with the microcapsules.

Figure 1A:
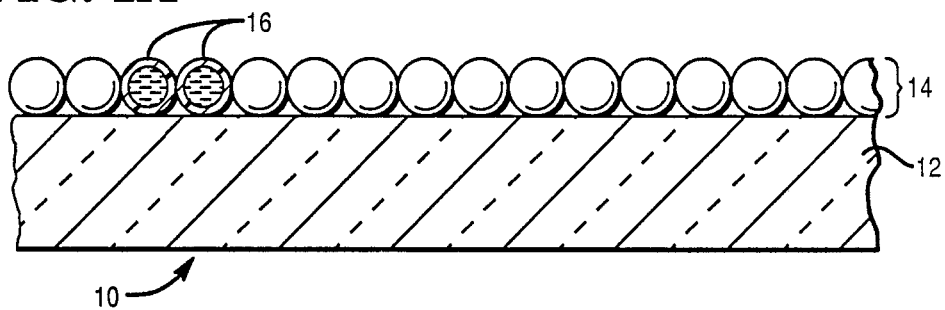
FIGS. 1A-1C are schematic illustrations in cross-section of a photosensitive media comprising an imaging web and receiver sheet for which the present invention is especially adapted, illustrating the imaging web, exposure of the web, and development of the image in the receiver sheet.

While shown in FIG. 1A, in actuality the microcapsules 14 are not visible to the unaided eye, since the mean size of the microcapsules generally ranges from approximately 1 to 25 microns.

Figure 1B:
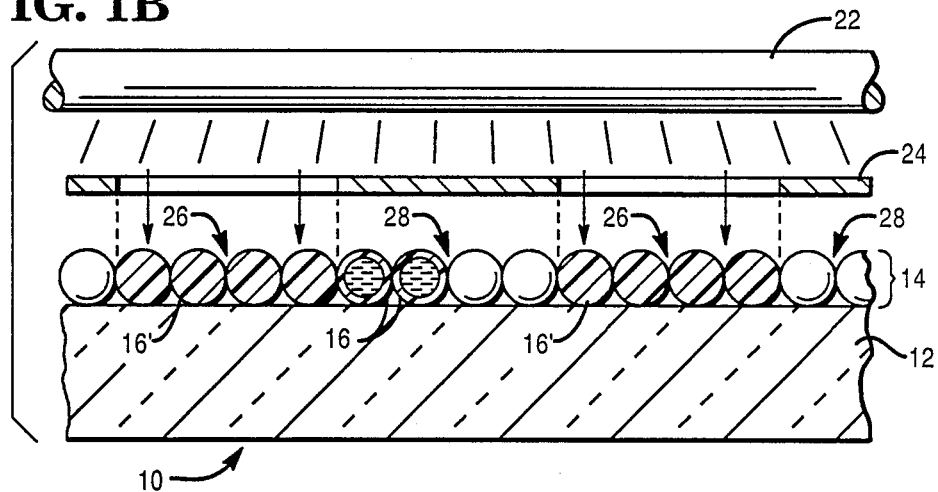

Exposure of the imaging web 10 by transmission imaging is shown in FIG. 1B. A source of radiant energy 22 is positioned above the surface of the imaging web 10 with a mask 24 positioned therebetween. As illustrated, the photosensitive material within the microcapsules 14 is a positive working radiation curable material, i.e., the viscosity of the material increases upon exposure to actinic radiation.

The radiation of the exposed area 26 causes the radiation curable composition in the internal phase 16 of the microcapsules 14 to polymerize, thereby gelling, solidifying or otherwise immobilizing the chromogenic material and preventing the chromogenic material from reacting with a developer material. To simplify the illustration, internal phase 16' in the exposed areas 26 is shown as a solid, whereas the internal phase 16 remains liquid in the unexposed areas 28.

The imaging web 10 is next processed by subjecting the imaging web to a uniform rupturing force by means of a pair of pressure rollers in resilient pressure engagement with the imaging web along a nip. The imaging web is moved between the rollers such that the rollers supply a uniform force to substantially the entire width of the imaging web to rupture the microcapsules 14 such that any non-polymerized chromogenic material contained within the microcapsules 14 or otherwise associated therewith can interact with a developer material.

Figure 1C:
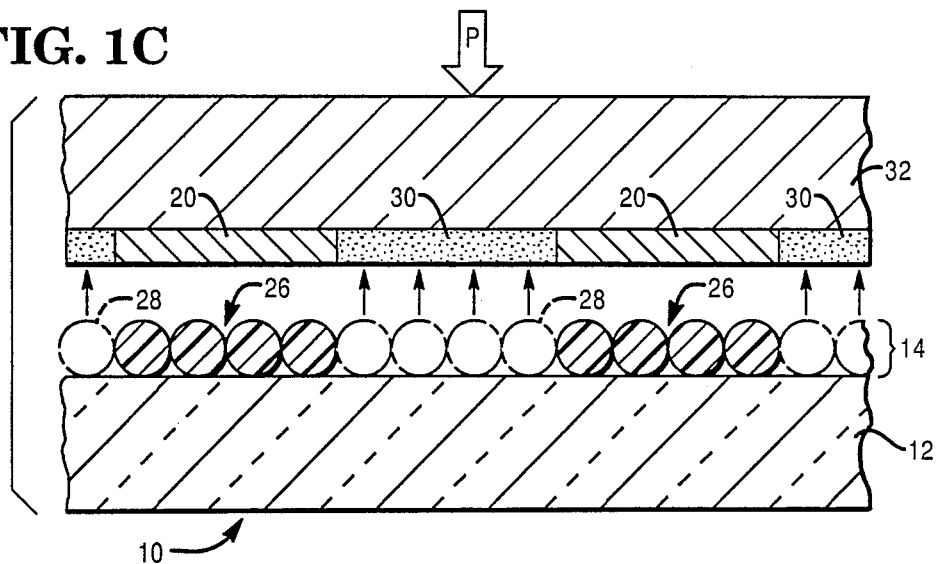

As shown in FIG. 1C, the necessary developer material 20 is formed as a layer of developer material on a separate substrate or receiver sheet 32. The receiver sheet 32 is aligned and in facing engagement with the transfer imaging web 10. As the uniform rupturing force is applied by the pressure rollers to the combination of the transfer imaging web 10 and the receiver sheet 32, the microcapsules 14 are ruptured and the non-polymerized internal phase migrates to the developer layer 20 of the receiver sheet 32, where it reacts with the developer material to form the image 30. Any chromogenic material which has been polymerized as a result of exposure does not undergo such reaction.

Preferred photosensitive compositions for use in the present invention are disclosed in U.S. Pat. No. 4,772,541. Preferred photoinitiators are disclosed in U.S. Pat. No. 4,772,530. A preferred developer composition is a finely divided coalescable thermoplastic developer resin as described in U.S. patent application Ser. No. 073,036 filed July 14, 1987.

For use with the present invention, the substrate 12 is at least partially transmissive to at least one wavelength of the radiation used for exposing the photosensitive media. Preferably, the substrate material is Mylar TM (PTE), with a thickness within the range of 0.5 to 2.0 mils.

Figure 2:
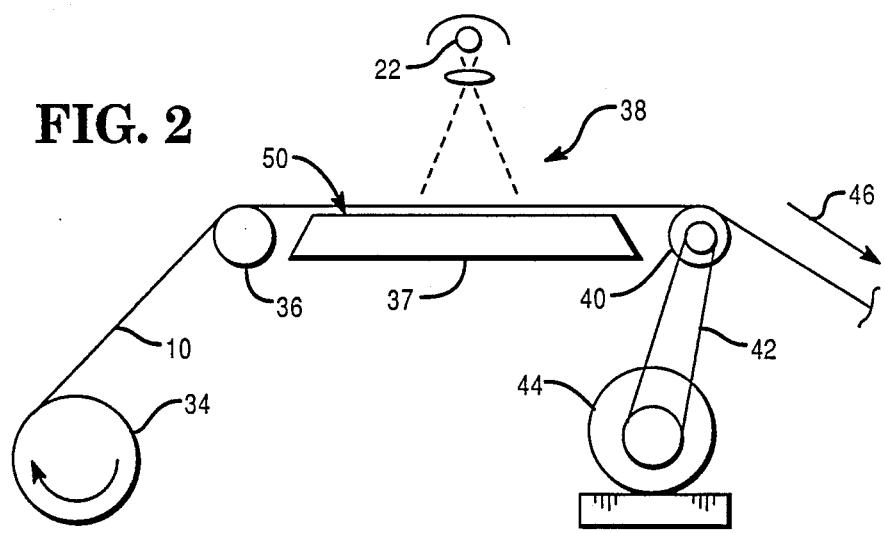
FIG. 2 is a schematic diagram of an apparatus for exposing the photosensitive media in accordance with the present invention.

An apparatus for exposing the photosensitive media can be seen by reference to FIG. 2. The media web 10 is held within a storage roll 34 from which the web 10 is drawn as needed. The web passes around a guide roll 36 which directs the web 10 onto a platen 37 within an exposure station 38. Within the exposure station, while the web remains stationary, actinic radiation from source 22 is directed onto the surface of web 10. Image information is acquired by the beam by appropriate means (not shown), for example by a photomask placed within the beam path.

At the output end of exposure station 38, web 10 is supported by a roll 40, which roll is connected by a drive belt 42 to a motor 44. Motor 44 is energized to advance web 10 between exposures to move exposed portions of web 10 from exposure station 38, and to draw unexposed web into the exposure station. Web 10 is then moved to an appropriate developer station (not shown) in the direction indicated by arrow 46. (An exemplary developer means may be seen, for example, in U.S. Pat. No. 4,727,392, which is hereby incorporated by reference.)

Positioned beneath web 10 within exposure station 38 is the supportive platen 37, which is provided with a reflective surface 50. This surface is selected to have greater reflectivity at wavelength within one (or more) selected band(s) of wavelengths than at wavelengths outside the selected band(s).

During exposure, light from source 22 passes through the microcapsules carried on the surface of web 10. Only a portion of the radiation is absorbed on the initial pass through the microcapsules, with a substantial amount of the radiation passing into the underlying substrate. Since the substrate is transmissive, this radiation strikes the reflective surface 50 of platen 37, and some radiation is passed back through the substrate and microcapsules on a second pass. Since this radiation will have a high proportion of light within the selected band, this additional exposure affects the color content of the overall exposure of the photosensitive media. Importantly, the resulting color adjustment is achieved by an additive rather than subtractive technique.

In a preferred embodiment of the invention, reflective surface 50 is formed from a dichroic mirror. Such a reflective device is preferably formed as a multi-layer structure having a stack of dielectric layers. The layers of the mirror are typically formed from two different materials, stacked in alternating fashion. The odd-numbered layers of the stack are formed from a material having a high index of refraction. Even numbered layers are each formed from a material having a relatively low index of refraction. The advantage of such a structure is that the device is selectively reflective to light within a desired wavelength band, and is essentially transmissive to all other light. The reflective device is tuned to the desired radiation band by adjusting the optical thickness of the various layers.

Methods for fabricating such a dichroic mirror are known in the art. Further details regarding the theory of such devices can be found by reference to Baumeister, "Interference, and Optical Interference Coatings," *Applied Optics & Optical Engineering*, pp. 285–323 (Kingslake ed., 1965).

Other wavelength-selective reflective devices, well known to those skilled in the art can also be used. In a normal case, the band pass of the reflective surface should be selected to yield an approximate neutral gray if the photosensitive material were to be exposed in the absence of a mask or other source of image information. In such a case, any color imbalance in the source or optics system may be compensated for, so that the color content of the image information will be unaffected. However, it is also possible to select the band pass of the reflector for color correction of the image information itself.

The described system can be fine tuned for color correction by placing additional, conventional color filters in the optical path.

It is also possible to form the reflective surface 50 from a metallic material. However, this will result in a non-color correcting system, although the reflected light will decrease required exposure times.

Preferably, reflective surface 50 is defined on platen 37, whereby reflective surface 50 is in contact with the rear surface of web 10. In this manner, the path length of the light between the microcapsules and the reflective surface is kept to a minimum, thereby reducing the possibility that light scattered by the microcapsules, substrate or reflective surface could adversely affect resolution. However, it should be recognized that the present system could be used with reflective surface 50 carried on a reflector which is spaced apart from the rear surface of web 10. In such a case, some other means for supporting the web within the exposure station will need to be provided, and image sharpness may be reduced.

The effectiveness of the present invention in improving film speed and color correction capabilities is illustrated by the following example. A yellow dichroic mirror was positioned against the bottom surface of microencapsulated photosensitive media of the type described herein. A target was placed on the top surface of the media and printed by contact. The results obtained were compared with a control exposure in which the photosensitive media was backed by a flat black platen.

Two conventional targets were used in exposing the media, a 21-step transparent density wedge, and a positive USAF 1951 test pattern. An EHA lamp was used as the source.

Figure 3:
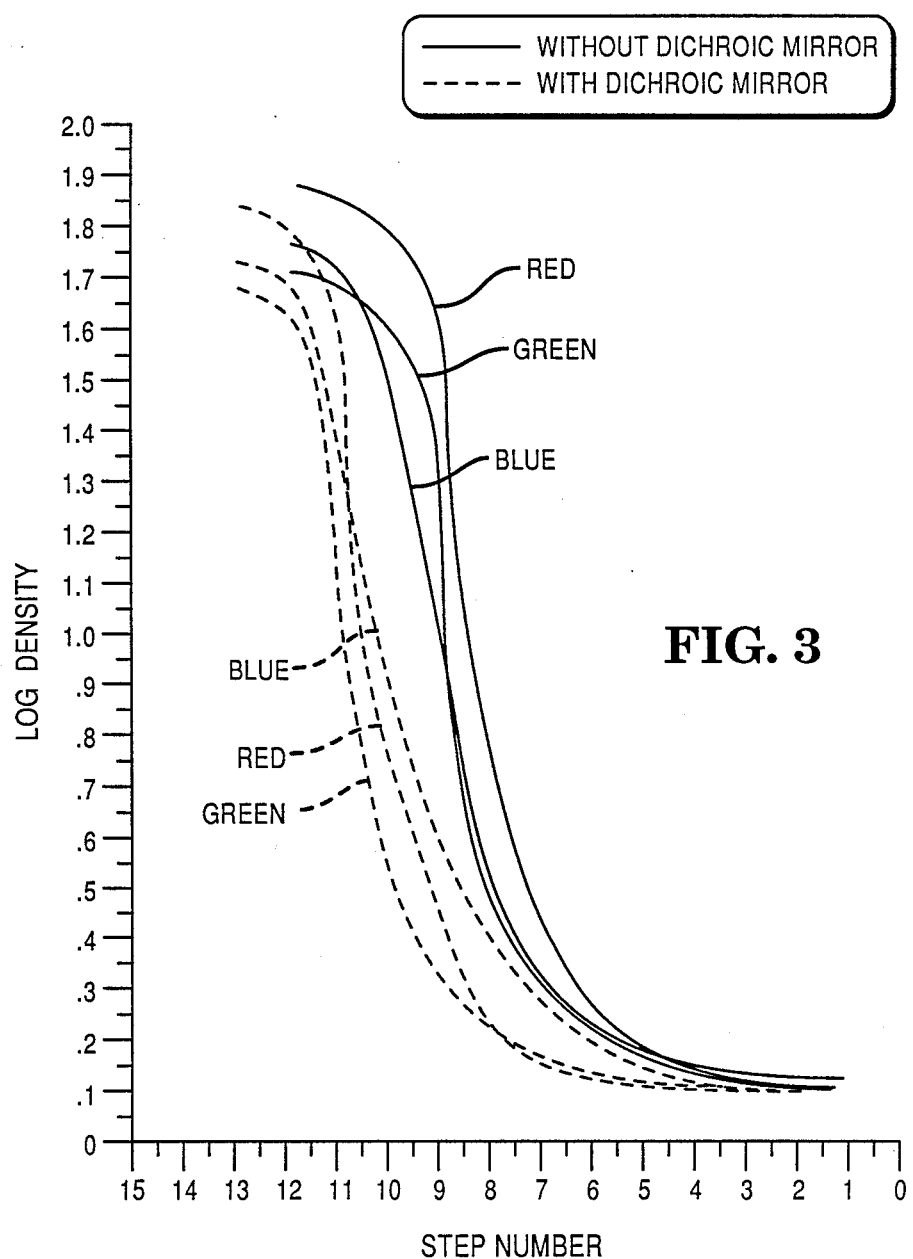
FIG. 3 is a plot illustrating and comparing exposure density achieved using the method of the present invention and using a conventional exposure method.

FIG. 3 shows three color D-log H curves taken from the step wedge exposures. From these results, the following conclusions can be drawn: (1) green and red midtone speeds are increased using the dichroic filter by approximately one f-stop; (2) the midtone color balance of the test wedge is shifted yellow by 0.12 log exposure units, or nearly one-half f-stop; (3) blue gamma has been noticeably reduced, with its dynamic range increased; and (4) D-max values are essentially unchanged. Since the mirror used in the test reflects little blue light, the blue midtone speed is affected less than that of other colors, which accounts for the shift in color balance. The observed reduction in blue gamma occurs mainly by softening the toe of the blue curve, and is not observed for the other curves. This may be explained by additional blue scattering within the capsule layer.

Effects of the reflective surface on image quality were tested by exposures of the resolution target. A sample exposed using the flat black platen had a resolution of 16 lp/mm. The sample exposed using the dichroic mirror had a resolution of 14 lp/mm. This difference is insignificant and has no practical consequences. Thus, it would appear that no adverse effect on resolution image quality is observed when using the reflector to enhance film speed.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. A method of exposing a photosensitive material wherein said material comprises a supportive substrate, said substrate being at least partially transmissive and having a layer of microcapsules on one surface thereof, said microcapsules containing a color precursor and a photohardenable or photosoftenable composition, the method comprising the steps of:

supporting said substrate to define a forward surface of said substrate carrying said microcapsules, and to define an opposite, rearward surface of said substrate;

positioning on the side of said substrate corresponding to said rearward surface a reflective surface, said reflective surface having a greater reflectivity of light within a selected wavelength band than outside of said band; and directing an exposure beam onto said forward side of said substrate, whereby at least a portion of said beam passes through said substrate to said reflective surface and is reflected back through said substrate, said greater reflectivity within said band increasing the relative color content of said beam at wavelengths within said band with respect to wavelengths outside of said band, wherein said reflective surface is a dichroic mirror.

2. The method as defined in claim 1, wherein said reflective surface is positioned against said rearward surface of said substrate.

3. Apparatus for exposing a photosensitive material, comprising:

means for supporting a sheet of said photosensitive material;

means for generating an exposure beam and directing said beam onto photosensitive media supported by said supporting means:

reflector means including a reflective surface having a greater reflectivity of light within a selected wavelength band than outside of said band; and reflector mounting means for positioning said reflective surface to receive said exposure beam after said beam has been directed onto and passed through the photosensitive material, whereby said greater reflectivity within said band increases the relative color content of said beam at wavelengths within said band with respect to wavelengths outside of said band, wherein said reflective surface is a dichroic mirror.

4. Apparatus as defined in claim 3, wherein said supporting means and said reflector mounting means together comprise a platen for disposing against a sheet of photosensitive material, said platen having said reflective surface formed thereon.

* * * * *